(12) United States Patent
Zheng et al.

(10) Patent No.: US 8,289,756 B2
(45) Date of Patent: Oct. 16, 2012

(54) NON VOLATILE MEMORY INCLUDING STABILIZING STRUCTURES

(75) Inventors: Yuankai Zheng, Bloomington, MN (US); Dimitar V. Dimitrov, Edina, MN (US); Dexin Wang, Eden Prairie, MN (US); Haiwen Xi, Prior Lake, MN (US); Xiaobin Wang, Chanhassen, MN (US); Wei Tian, Bloomington, MN (US); Xiaohua Lou, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 344 days.

(21) Appl. No.: 12/502,213

(22) Filed: Jul. 13, 2009

(65) Prior Publication Data

US 2010/0128520 A1 May 27, 2010

Related U.S. Application Data

(60) Provisional application No. 61/117,660, filed on Nov. 25, 2008.

(51) Int. Cl.
*G11C 11/00* (2006.01)

(52) U.S. Cl. ......... 365/158; 257/421; 365/171; 365/173

(58) Field of Classification Search .................. 257/421, 257/422, 427, E27.006
See application file for complete search history.

(56) References Cited

U.S. PATENT DOCUMENTS

| | | | |
|---|---|---|---|
| 4,733,371 A | 3/1988 | Terada | |
| 5,191,223 A | 3/1993 | Munekata | |
| 5,646,419 A | 7/1997 | McCaldin | |
| 5,673,225 A | 9/1997 | Jeong | |
| 5,761,115 A | 6/1998 | Kozicki | |
| 5,920,446 A | 7/1999 | Gill | |
| 5,982,670 A | 11/1999 | Yamashita | |
| 6,072,718 A | 6/2000 | Abraham | |
| 6,178,136 B1 | 1/2001 | Lin | |
| 6,226,197 B1 | 5/2001 | Nishimura | |
| 6,252,796 B1 | 6/2001 | Lenssen | |
| 6,381,106 B1 | 4/2002 | Pinarbasi | |
| 6,469,926 B1 | 10/2002 | Chen | |
| 6,473,279 B2 * | 10/2002 | Smith et al. ............... | 360/324.12 |
| 6,532,164 B2 | 3/2003 | Redon | |
| 6,542,000 B1 | 4/2003 | Black | |
| 6,569,745 B2 | 5/2003 | Hsu | |
| 6,584,016 B2 | 6/2003 | Park | |

(Continued)

FOREIGN PATENT DOCUMENTS

GB 2 422 735 8/2006

(Continued)

OTHER PUBLICATIONS

Baek et al., Tech. Dig. IEDM (2004) 587.

(Continued)

*Primary Examiner* — Alexander Sofocleous
(74) *Attorney, Agent, or Firm* — Mueting, Raasch & Gebhardt PA (57) ABSTRACT

An apparatus that includes a magnetic structure including a reference layer; and a free layer; an exchange coupling spacer layer; and a stabilizing layer, wherein the exchange coupling spacer layer is between the magnetic structure and the stabilizing layer and exchange couples the free layer of the magnetic structure to the stabilizing layer.

23 Claims, 8 Drawing Sheets

U.S. PATENT DOCUMENTS

| | | |
|---|---|---|
| 6,602,677 B1 | 8/2003 | Wood et al. |
| 6,633,498 B1 | 10/2003 | Engel |
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhattacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter |
| 6,809,909 B2 | 10/2004 | Hou |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,709 B2 | 5/2005 | Princinsky et al. |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissel |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Panchula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Vang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,765 B2 | 8/2008 | Childress |
| 7,411,815 B2 | 8/2008 | Gogl |
| 7,430,135 B2 | 9/2008 | Huai |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apalkov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,728,622 B2 | 6/2010 | Chua-Eoan et al. |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0233017 A1 | 10/2006 | Hosotami |
| 2006/0245117 A1 | 11/2006 | Nowak |
| 2007/0002504 A1 | 1/2007 | Huai et al. |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1* | 5/2007 | Yoshikawa et al. ............ 257/421 |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |

| | | |
|---|---|---|
| 2007/0246787 A1 | 10/2007 | Wang |
| 2007/0297220 A1 | 12/2007 | Yoshikawa |
| 2008/0026253 A1 | 1/2008 | Yuasa |
| 2008/0032159 A1* | 2/2008 | Gill .......................... 428/811.2 |
| 2008/0055792 A1 | 3/2008 | Zheng |
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagasi |
| 2010/0176471 A1 | 7/2010 | Zhu |

FOREIGN PATENT DOCUMENTS

WO    WO 2008/100868    8/2008

OTHER PUBLICATIONS

Black et al., Programmable Logic Using Giant Magnetoresistance and Spin-Dependent Tunneling Devices (Invited), J. Appl. Phys. 87, 6674 (2000).

Chu et al., Fabrication of Ideally Ordered Nanoporous Alumina Films and Integrated Alumina Nanotubule Arrays by High-Field Anodization, Adv. Mater. 2005, 17, 2115-2119.

Cowburn et al., Room Temperature Magnetic Quantum Cellular Automata, Science 287, 1466 (2000).

de Groot et al., New Class of Materials: Half-Metallic Ferromagnets, Physics Review Letters, 50, 2024 (1983).

Egelhoff et al., Oxygen as a Surfactant in the Growth of Giant Magnetoresistance Spin Valves, Journal of Applied Physics 82 (12), Dec. 15, 1997.

Emley, N.C., et al., Reduction of Spin Transfer by Synthetic Antiferromagnets, Applied Physics Letters, May 24, 2004, pp. 4257-4259, vol. 84, No. 21.

Folk et al., A Gate-Controlled Bidirectional Spin Filter Using Quantum Coherence, Science, vol. 299, Jan. 31, 2003, pp. 679-682.

Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-L1060.

Huczko, Template-Based Synthesis of Nanomaterials, Appl. Phys. A 70, 365-376 (2000).

Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.

Li et al., Role of Oxygen Exposure in Different Positions in the Synthetic Spin Valves, Journal of Applied Physics, vol. 93, No. 10, May 15, 2003.

Macak et al., High-Aspect-Ratio TiO2, Nanotubes by Anodization of Titanium, Angew. Chem. Int. Ed. 2005, 44, 2100-2102.

Masuda and Kenji Fukuda, Science, 268, 1466 91995).

Masuda et al., Ordered Metal Nanohole Arrays Made by a Two-Step Replication of Honeycomb Structures of Anodic Alumina, Science, OI. 268, Jun. 9, 1995.

Meng et al., A Spintronics Full Adder for Magnetic CPU, IEEE Elec. Dev. Lett. 26, 360 (2005).

Meng et al., Spin Transfer in Nanomagnetic Devices with Perpendicular Anistropy, Applied Physics Letters 88, 172506 (2006).

Miura et al., A Novel SPRAM (Spin Transfer Torque RAM) with a Synthetic Ferrimagnetic Free Layer . . . , VLSI Symposium on VLSI Tech. Digest of Technical Papers (2007).

Ney et al., Programmable Computing with a Single Magnetoresistance Element, Nature 425, 485 (2003).

PCT Search Report and Written Opinion dated Oct. 4, 2010, Our Ref: 15010WO00.

PCT Search Report and Written Opinion dated Mar. 10, 2010, Our Ref: 13835WO00.

PCT Search Report and Written Opinion dated Mar. 22, 2010.

Seki et al., Spin-Polarized Current-Induced Magnetization Reversal in Perpendicularly Magnetized L1o-FePt Layers, Applied Physics Letters 88, 172504 (2006).

Sharrock, Time Dependence of Switching Fields in Magnetic Recording Media (Invited), J. Appl. Phys. 76 (10), Nov. 15, 1994.

Sun, Current-Driven Magnetic Switching in Manganite Trilayer Junctions, Journal of Magnetism and Magnetic Materials 202 (1999) 157-162.

Thurn-Albrecht et al., Science, 290, 2126 (2000).

U.S. Appl. No. 12/416,976, filed Apr. 2, 2009, Inventor: Zheng.

U.S. Appl. No. 12/106,382, filed Apr. 21, 2008, Inventors: Xi et al.

U.S. Appl. No. 12/125,975, filed May 23, 2008, Inventor: Xi.

U.S. Appl. No. 12/126,014, filed May 23, 2008, Inventor: Xiaohua Lou.

U.S. Appl. No. 12/170,519, filed Jul. 10, 2008, Inventors: Xi et al.

U.S. Appl. No. 12/175,545, filed Jul. 18, 2008, Inventor: Lou.

U.S. Appl. No. 12/239,882, filed Sep. 29, 2008, Inventor: Zheng et al.

U.S. Appl. No. 12/239,887, filed Sep. 29, 2008; Inventor: Zheng.

U.S. Appl. No. 12/258,476, filed Oct. 27, 2008, Inventor: Lou.

U.S. Appl. No. 12/258,491, filed Oct. 27, 2008, Inventor: Lou.

U.S. Appl. No. 12/258,492, filed Oct. 27, 2008, Inventor: Lou.

U.S. Appl. No. 12/269,507, filed Nov. 12, 2008, Inventor: Tian.

U.S. Appl. No. 12/269,514, filed Nov. 12, 2008, Inventor: Venkatasamy.

U.S. Appl. No. 12/269,537, filed Nov. 12, 2008, Inventor: Tang et al.

U.S. Appl. No. 12/396,905, filed Mar. 3, 2009, Inventor: Gao.

U.S. Appl. No. 12/398,214, filed Mar. 5, 2009, Inventor: Wang et al.

U.S. Appl. No. 12/425,457, filed Apr. 17, 2009, Inventor: Gao.

Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).

Wendt et al., Electronic and Vibrational Properties of Ultrathin SiO2 Films Grown on Mo(112), 2005, Phys. Rev. vol. B72, pp. 1150409-1-115409.0.

Yan et al., Magnesium Oxide as a Candidate High-k Gate Dielectric, 2006, Applied Physics Lett. vol. 88, pp. 142901-1-142901-3.

Yen et al., Reduction in Critical Current Density for Spin Torque Transfer Switching with Composite Free Layer, Applied Physics Letters 93, 092504 (2008).

Zheng et al., Low Switching Current Flux-Closed Magnetoresistive Random Access Memory, Journal of Applied Physics, May 15, 2003.

Zhuang et al., Tech Dig. IEDM (2002) 193.

Y. Zheng et al., Magnetic Random Access Memory (MRAM), J. NanoSci. And NanoTec. 7, 117-137 (2007).

Prejbeanu et al., Thermally Assisted MRAM, J. Phys. Condens. Matter 19 (2007) 165218.

Slonczweski, Current-Driven Excitation of Magnetic Multilayers, J. Magn. Mater. 159 (1996) L1-L7.

Berger, Emission of Spin Waves by Magnetic Multilayer Traversed by a Current, Physic. Review B 54, 9353 (1996).

Sun, Spin Current Interaction with Monodomain Magnetic Body: A Model Study, Phys. Rev. B, 62, 570 (2000).

Korenivski, et al., Thermally Activiated Switching in Spin-Flop Tunnel Junctions, Applied Physics Letters 86, 252506 (2005).

* cited by examiner

NON VOLATILE MEMORY INCLUDING STABILIZING STRUCTURES

PRIORITY

This application claims priority to U.S. Provisional Application No. 61/117,660 entitled "ST RAM WITH EXCHANGE COUPLED SAF STABLE LAYER" filed on Nov. 25, 2008, the disclosure of which is incorporated herein by reference.

BACKGROUND

New types of memory have demonstrated significant potential to compete with commonly utilized types of memory. For example, non-volatile spin-transfer torque random access memory (referred to herein as "STRAM") and resistive random access memory (referred to herein as "RRAM") are both considered good candidates for the next generation of memory.

In order to reverse a STRAM cell, the spin torque from the writing current has to overcome the in-plane anisotropy (which is equal to $2\pi Ms$, where Ms is the saturation magnetization). The in-plane anisotropic field is about 5000 Oersted (Oe) for a nickel iron (NiFe) layer. The thermal stability and retention characteristics of such a cell is provided by the uni-axial anisotropic field, which is only around 500 Oe. A memory cell that reduces the in-plane anisotropic field, thereby affording a cell that is easier to switch, but increases the uni-axial anisotropic field, thereby affording a cell that is more thermally stable and retains the state written to it.

BRIEF SUMMARY

A apparatus that includes a magnetic structure including a reference layer; and a free layer; an exchange coupling spacer layer; and a stabilizing layer, wherein the exchange coupling spacer layer is between the magnetic structure and the stabilizing layer and exchange couples the free layer of the magnetic structure to the stabilizing layer.

A non volatile memory cell including a spin torque transfer random access memory (STRAM) structure that includes a reference layer; a tunnel barrier; and a recording layer, wherein the tunnel barrier is between the reference layer and the recording layer; an exchange coupling spacer layer; and a stabilizing structure, wherein the exchange coupling spacer layer is between the STRAM structure and the stabilizing structure and exchange couples the recording layer of the STRAM structure to the stabilizing structure.

A method of determining the state of a non volatile memory cell including the steps of: providing a non volatile memory cell, the non volatile memory cell including a spin torque transfer random access memory (STRAM) structure; an exchange coupling spacer layer; and a stabilizing structure that includes a synthetic antiferromagnetic (SAF) structure that includes a first ferromagnetic layer, a nonmagnetic spacer layer and a second ferromagnetic layer, wherein the nonmagnetic spacer layer is between the first ferromagnetic layer and the second ferromagnetic layer; and an upper reference layer, wherein the upper reference layer is proximate to the second ferromagnetic layer, directing a current across the non volatile memory cell, wherein the current is directed from the stabilizing structure to the STRAM structure; measuring a voltage, wherein the voltage is dependent on the magnetic orientation of the upper reference layer with respect to the second ferromagnetic layer of the SAF structure and the orientation of the upper reference layer with respect to the second ferromagnetic layer can be changed to reflect one of the two states of the non volatile memory cell.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

Non volatile memory cells as disclosed herein include stabilizing structures. The stabilizing structures generally function to increase the thermal stability or other characteristics of the non volatile memory cells while still allowing the non volatile memory cells to have an aspect ratio of close to about 1 (i.e. substantially circular instead of elliptical). The stabilizing structure can utilize different methods and materials to accomplish this improvement.

A non volatile memory cell utilized herein can include many different types of memory. Exemplary types of memory that can be utilized in devices disclosed herein include, but are not limited to non volatile memory such as, resistive sense memory (RSM). RSM is memory that has changeable resistance that affords data storage using different resistance states of the RSM. Exemplary types of RSM include, but are not limited to, magnetoresistive RAM (MRAM); resistive RAM (RRAM); and spin torque transfer RAM, which is also referred to as STRAM.

Figure 1A:
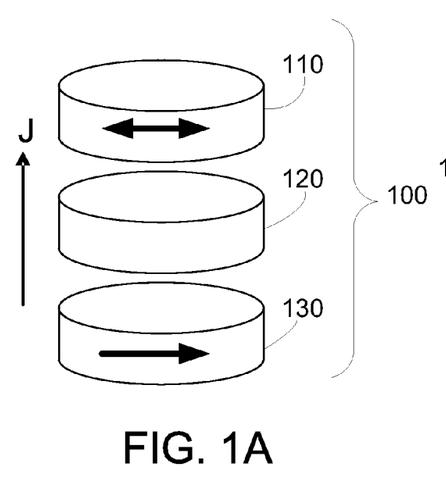
FIGS. 1A and 1B are schematic diagrams of non volatile spin-transfer torque random access memory (STRAM) structures.
Figure 1B:
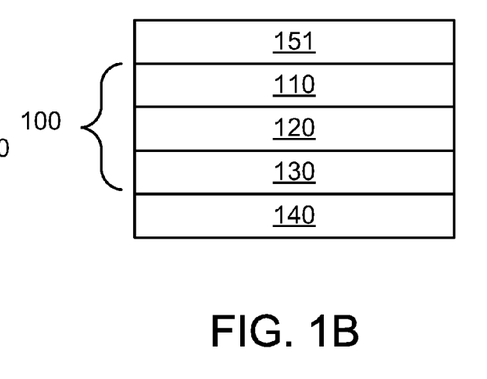

In embodiments, the RSM can include STRAM. STRAM includes a MTJ (magnetic tunnel junction), which generally includes two magnetic electrode layers separated by a thin insulating layer, which is also known as a tunnel barrier. An embodiment of a MTJ is depicted in FIG. 1A. The MTJ 100 in FIG. 1A includes a first magnetic layer 130, which can also be referred to as a pinned layer or reference layer, and a second magnetic layer 110, which can also be referred to as a free layer or a recording layer. The reference layer 130 and the recording layer 110 are separated by an insulating layer 120. FIG. 1B depicts a MTJ 100 in contact with a first electrode layer 140 and a second electrode layer 151. The first electrode layer 140 and the second electrode layer 151 electrically connect the reference layer 130 and the recording layer 110 respectively to a control circuit (not shown) providing read and write currents through the magnetic layers. The relative orientation of the magnetization vectors of the reference layer 130 and the recording layer 110 can be determined by the resistance across the MTJ 100; and the resistance across the MTJ 100 can be determined by the relative orientation of the magnetization vectors of the reference layer 130 and the recording layer 110.

The reference layer 130 and the recording layer 110 are generally made of ferromagnetic alloys such as iron (Fe), cobalt (Co), and nickel (Ni) alloys. Pinning of the reference layer 130 may be achieved through, e.g., the use of exchange bias with an antiferromagnetically ordered material such as PtMn, IrMn and others. The insulating layer 120 is generally made of an insulating material such as aluminum oxide ($Al_2O_3$) or magnesium oxide (MgO).

In embodiments, the recording layer 110 can be a relatively thin recording layer. In embodiments, the recording layer 110 can be from about 1 nm to about 5 nm thick. In embodiments, the recording layer 110 can be from about 1 nm to about 3 nm thick. In embodiments, the recording layer 110 can have a relatively high spin polarization. In embodiments, the recording layer 110 can have a spin polarization that is equal to or greater than about 0.5. In embodiments, the recording layer 110 can generally be made of ferromagnetic alloys such as iron (Fe), cobalt (Co), and nickel (Ni) alloys.

Figure 1C:
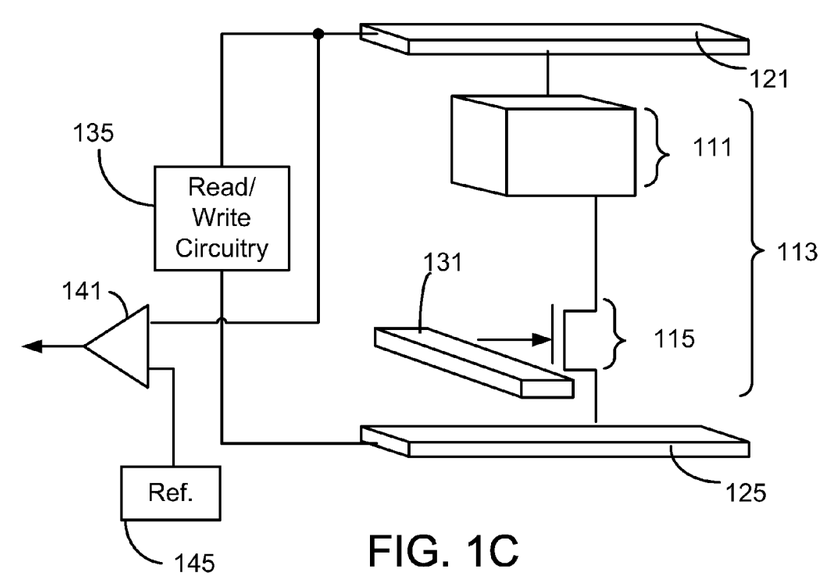
FIG. 1C is a schematic diagram of a STRAM cell within a system for utilizing the STRAM cell as memory.

FIG. 1C illustrates a memory device that includes a memory element 113 that can include a memory cell 111 and its corresponding transistor 115. Single memory elements 113 can be configured within larger systems. The memory element 113 can be operatively coupled between a bit line 121 and a source line 125 within a larger system. The read/write circuitry 135 controls the particular bit line 121 and source line 125 that current passes through, thereby controlling the particular memory cell that is read from or written to. The read/write circuitry 135 can also control the voltage applied across the bit line 121 or memory element 113 from the source line 125 (or vice versa). The direction which current flows across a memory cell 111 is determined by the voltage differential across the bit line 121 and the source line 125.

A particular memory cell 111 can be read from by activating its corresponding transistor 115, which when turned on, allows current to flow from the bit line 121 through the memory cell 111 to the source line 125 (or vice versa). The transistor 115 is activated and deactivated through the word line 131. The word line 131 is operatively coupled to and supplies a voltage to the transistor 115 to turn the transistor on so that current can flow to the memory cell 111. A voltage, dependent on the resistance of the memory cell 111 is then detected by the sense amplifier 141 from the source line 125 (for example). The voltage differential between the bit line 121 and the source line 125 (or vice versa), which is indicative of the resistance of the memory cell 111 is then compared to a reference voltage 145 and amplified by the sense amplifier 141 to determine whether the memory cell 111 contains a "1" or a "0".

In order to affect (either read from or write to) a memory cell, a current is passed through the STRAM stack perpendicular to the stack. By changing the direction of the current, the direction of the recording layer can be set either parallel or anti-parallel to the reference layer. In a STRAM cell with an in-plane recording layer the spin torque needs to overcome the in-plane anisotropy of the recording layer in order to affect the magnetization of the recording layer. The current necessary to do this ($J_{c0}$) can be seen in Equation I below.

$$J_{c0} = \frac{1}{\eta}\left(\frac{2e}{\hbar}\right)\alpha Mt(H_K + 2\pi M + H) \qquad \text{(Equation I)}$$

In Equation I, $\eta$ is the spin polarization efficiency of the current, $2e/\hbar$ is a constant, $\alpha$ is the damping constant, $H_K$ and H are the anisotropy field and external field respectively, and $M_s$ is the saturation magnetization of the recording layer.

Generally, the term $2\pi M$ reflects the in-plane anisotropy and the term Hk reflects the anisotropy. For a typical recording layer (for example, NiFe or CoFeB) the in-plane anisotropy ($2\pi M$) is much larger than the anisotropy field (Hk). The switching current in such a STRAM cell is mostly dominated by the in-plane anisotropy ($2\pi M$) while the thermal stability and retention are mostly dominated by (Hk). Therefore, the large $2\pi M$ term makes the switching current high but does not substantially improve the thermal stability and retention.

Figure 2A:
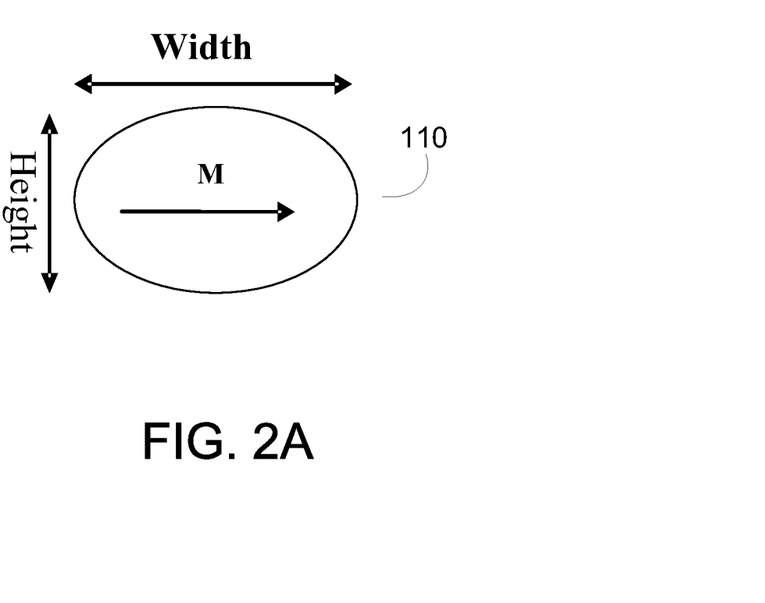
FIGS. 2A, 2B, and 2C are a schematic diagram defining the relevant dimensions of a STRAM structures (FIG. 2A), a graph showing how the width and height affect the effective size of the STRAM structure (FIG. 2B), and a graph showing how the driving current is effected by the effective size (FIG. 2C)
Figure 2B:
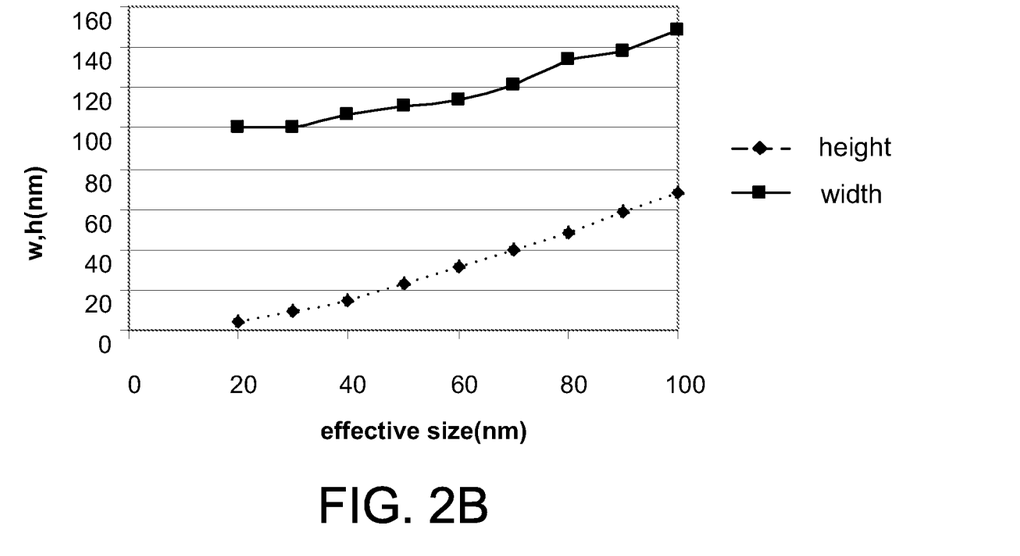
Figure 2C:
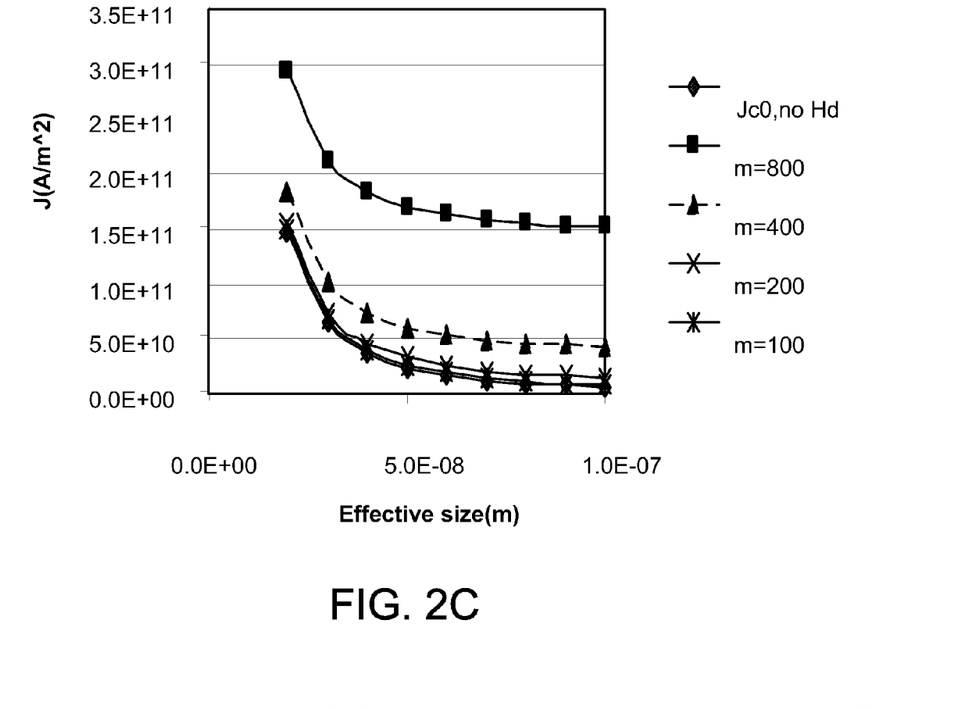

Since the intrinsic anisotropy of NiFe and CoFeB (exemplary STRAM materials) is low, STRAM cells are commonly manufactured to have an elliptically shaped recording layer in order to induce sufficient thermal stability, by increasing Hk. FIG. 2A depicts an elliptically shaped recording layer 110 of a STRAM cell. The recording layer 110 has a width (also referred to as "w") and a height (also referred to as "h"). FIG. 2B shows width and height requirements of thermally stable cells. The data in FIG. 2B assumes that the saturation magnetization (Ms) is about 800 emu/cc (typical for NiFe) and the thickness of the recording layer is 3 nm. The effective size is the square root of (width*height). FIG. 2C shows the dependence of the switching current ($J(A/m^2)$) on the effective cell size (nm) for cells having different saturation magnetization (Ms) values From a review of FIGS. 2B and 2C, it can be seen that for smaller STRAM cell sizes, larger aspect ratios are generally utilized to maintain thermal stability. For STRAM cells having smaller saturation magnetization (Ms), smaller critical switching currents can be achieved. However it is very difficult to meet the requirement of both sufficient thermal stability and low switching currents with a single recording layer with low Ms.

Non volatile memory cells disclosed herein provide increased thermal stability while maintaining small cell sizes and more importantly small aspect ratios. Non volatile memory cells disclosed herein generally include a stabilizing structure that is exchange coupled with the recording layer of the MTJ stack. The materials of the stabilizing structure afford increased thermal stability of the MTJ stack even at aspect ratios approaching 1.

Figure 3:
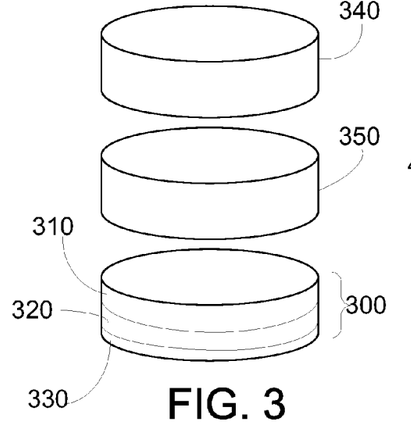
FIG. 3 is a schematic diagram of a STRAM cell that includes an embodiment of a stabilizing structure.

FIG. 3 illustrates embodiments of non volatile memory cells disclosed herein. Generally, non volatile memory cells disclosed herein include a MTJ stack 300, an exchange coupling spacer layer 350, and a stabilizing structure 340. The exchange coupling spacer layer 350 is generally disposed between the MTJ stack 300 and the stabilizing structure 340. The MTJ stack 300 includes layers such as those discussed above, a reference layer 330, a tunnel barrier structure 320, and a recording layer 310. The properties, functions and materials discussed above are applicable herein. Specifically, the recording layer 310 of the MTJ stack 300 generally has a relatively low saturation magnetization and can create a relatively large spin polarization in the electrical current used to switch the MTJ.

The exchange coupling spacer layer 350 generally functions to magnetically couple (either ferromagnetically or antiferromagnetically) the recording layer 310 and the stabilizing structure 340. The exchange coupling spacer layer 350 can be made of various materials, including but not limited to, conductive metals such as copper (Cu), tantalum (Ta), ruthenium (Ru), palladium (Pd), platinum (Pt), chromium (Cr), gold (Au), and the like; thin layers of oxide materials such as magnesium oxide (MgO), alumina (AlO), titanium oxide (TiO), tantalum oxide (TaO), and the like; or combinations thereof. Generally, the exchange coupling spacer layer 350 can be about 5 nanometers (nm) thick if it is made of a conductive metal and about 1 nm thick if made of an oxide material.

Generally, the magnitude of the exchange coupling between the recording layer 310 and the stabilizing structure 340 can be at least partially controlled by the materials and thickness of the exchange coupling spacer layer 350. In embodiments, the coupling field between the recording layer 310 and the stabilizing structure 340 will not significantly affect the critical current density for switching. In embodiments, the coupling field can reverse the stabilizing structure with or without the aid of the static field from the recording layer 310. In embodiments, the magnitude of the coupling between the recording layer 310 and the stabilizing structure 340 can be in the range of about 50 to about 500 Oe.

Generally, exchange coupling can be considered to be strong exchange coupling if the exchange field (Hex) is equal to or greater than about 1000 Oe. An exchange coupling can be considered to be an intermediate exchange coupling if the exchange field (Hex) is from about 100 Oe to about 1000 Oe.

Embodiments can include a recording layer 310 that creates a relatively large spin polarization in the electrical current and also has a relatively low net magnetic moment (Ms*t). The recording layer 310 is exchange coupled (either ferromagnetically or antiferromagnetically) to the stabilizing layer 340. The exchange coupling can be intermediate, in an embodiment from about 50 to 500 Oe. Therefore, the switching current will not be detrimentally affected. The exchange coupling can serve to increase the total thermal barrier (KuV/kT). In embodiments, the thermal barrier factor can be increased from about 20 to 30 (without the stabilizing layer) to about 40 or more (with the stabilizing layer). In embodiments where the thermal barrier factor is increased, for example to 40 or more, the recording layer will be more stable (i.e., not super-paramagnetic) at room temperature. Because the net moment of the recording layer is small, a substantial reduction in switching current can be achieved.

The stabilizing structure 340 generally has a high thermal stability, even when formed in a circular shape (e.g. aspect ratio equals 1). The stabilizing structure 340 is generally exchange coupled to the recording layer 310. The stabilizing structure 340 can include a single layer or more than one layer. In embodiments, the stabilizing layer can include ferromagnetic layers having acceptable anisotropy. In embodiments, an acceptable anisotropy (Hk) for the stabilizing layer can be greater than or equal to about 300 Oe. In embodiments, the stabilizing structure 740 can generally be made of ferromagnetic alloys such as iron (Fe), cobalt (Co), and nickel (Ni) alloys, including but not limited to CoCr, CoPt, FePt, CoCrPt, and the like. In embodiments, the stabilizing structure can have a thickness from about 2 nm to about 20 nm.

In embodiments, the stabilizing structure 340 can include synthetic antiferromagnetic (SAF) materials or a SAF structure. SAF structures generally include two or more ferromagnetic layers separated by a nonmagnetic layer (or more than one nonmagnetic layer in the case of more than two ferromagnetic layers). The ferromagnetic layers are antiferromagnetically coupled, which provides the SAF structures with a relatively high thermal stability. SAF structures also generally have large intrinsic anisotropy and do not require any shape induced anisotropy.

Figure 4A:
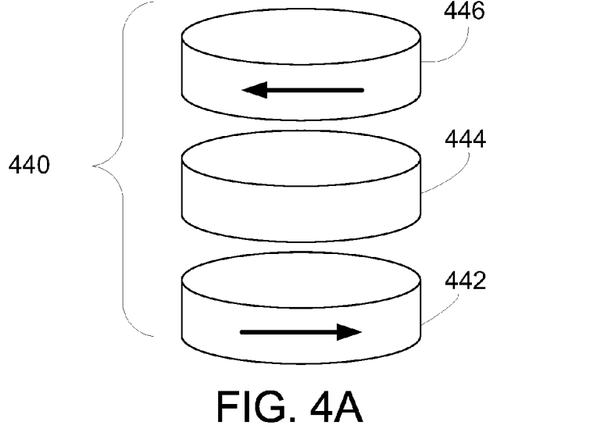
FIGS. 4A through 4E are schematic diagrams of embodiments of a stabilizing structure (FIG. 4A), a STRAM cell including such a stabilizing structure (FIG. 4B), the STRAM cell of FIG. 4B with the STRAM structure antiferromagnetically coupled to the stabilizing structure after a first current has been passed through it in a first direction (FIG. 4C), the STRAM cell of FIG. 4B with the STRAM structure ferromagnetically coupled to the stabilizing structure after a first current has been passed through it in a first direction (FIG. 4D), and the STRAM cell of FIG. 4B with the STRAM structure antiferromagnetically coupled to the stabilizing structure after a second current has been passed through it in a first direction (FIG. 4E)

FIG. 4A shows an example of a stabilizing structure 440 that includes a SAF structure. The stabilizing structure 440 includes a first ferromagnetic layer 442, a nonmagnetic spacer layer 444 and a second ferromagnetic layer 446. As seen by the arrows on the first ferromagnetic layer 442 and the second ferromagnetic layer 446, the two layers are antiferromagnetically coupled. The magnetic orientation of the SAF structure (i.e. the three layer structure seen in FIG. 4A) can be affected by an external magnetic field. For example, a magnetic field can affect the first ferromagnetic layer 442 thereby reorienting the magnetic field to the left (the opposite of that seen in FIG. 4A), this will then switch the magnetic orientation of the second ferromagnetic layer 446 so that it is oriented to the right (the opposite of that seen in FIG. 4A). The switch of the first ferromagnetic layer 442 can happen before, simultaneous with, or substantially simultaneously with the switch of the second ferromagnetic layer 446.

The SAF structure 440 can be made of any materials that will exhibit the above discussed characteristics. Exemplary materials for the first and second ferromagnetic layers 442 and 446 include, but are not limited to, cobalt (Co), nickel (Ni), iron (Fe), and combinations thereof. In embodiments, the ferromagnetic layers can include CoFe, NiFe, and combinations thereof. The first and second ferromagnetic layers 442 and 446 can generally have thicknesses from about 1.5 nm to about 5 nm. Exemplary materials for the nonmagnetic spacer layer 444 include, but are not limited to, ruthenium (Ru), copper (Cu), rhodium (Rh), iridium (Ir), palladium (Pd), chromium (Cr), and the like, or combinations thereof. In embodiments, the nonmagnetic spacer layer 444 can include Ru or Cu. The nonmagnetic spacer layer 444 can generally have a thickness from about 0.3 nm to about 3 nm.

Figure 4B:
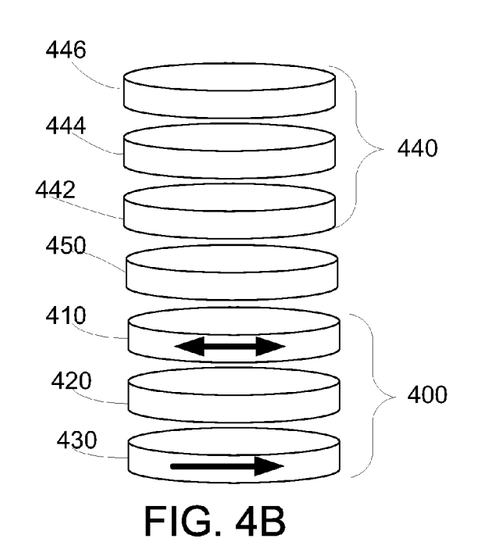

FIG. 4B shows a non volatile memory cell that includes a stabilizing structure 440 as illustrated in the embodiment of FIG. 4A. The exemplary non volatile memory cell includes a MTJ stack 400 having a reference layer 430, a tunnel barrier structure 420 and a recording layer 410. The MTJ stack 400 is separated from the stabilizing structure 440 by an exchange coupling spacer layer 450. This embodiment of a stabilizing structure 440 includes a first ferromagnetic layer 442 and a second ferromagnetic layer 446 separated by a nonmagnetic spacer layer 444. Exemplary characteristics and materials for the various layers of the non volatile memory cell can be as discussed above.

Figure 4C:
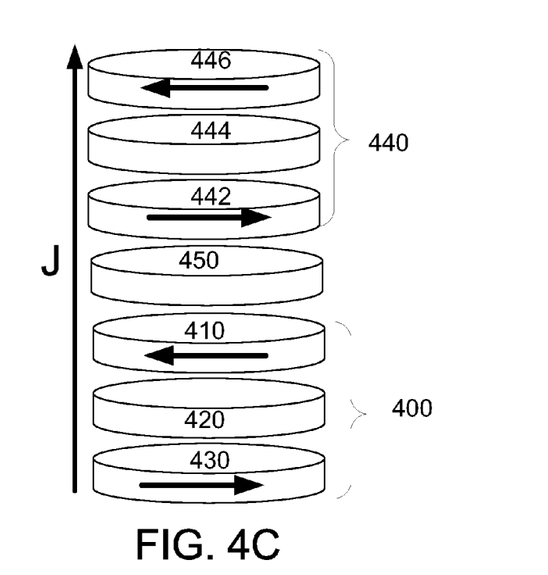

FIG. 4C depicts the non volatile memory cell after application of a current (J in FIG. 4C) that is sufficient to write to the MTJ stack. The current is directed from the bottom of the MTJ stack to the top of the MTJ stack (i.e. in the direction from the transistor to the MTJ) in order to write a "1" (i.e. the high resistance state, wherein the recording layer 410 and the reference layer 430 have opposite polarities). As seen in FIG. 4C, the current will set the recording layer 410 to a magnetization (indicated by the left pointing arrow in the recording layer 410) that is opposite to that of the reference layer 430 (which is pinned). The magnetic orientation of the recording layer 410 will affect the first ferromagnetic layer 442 of the stabilizing structure 440 because of the exchange coupling of the recording layer 410 and the stabilizing structure 440. The first ferromagnetic layer 442 will then affect the second ferromagnetic layer 446 because of its coupling so that the second ferromagnetic layer 446 is changed (if the first ferromagnetic layer 442 was changed) to be anti-parallel to the first ferromagnetic layer 442. The timing of the switching of the recording layer 410, the first ferromagnetic layer 442, and the second ferromagnetic layer 446 are not necessarily sequential, and may indeed occur at substantially the same time.

Upon application of the current, the first ferromagnetic layer 442 will either remain antiferromagnetically coupled with the recording layer 410 or will switch its magnetization direction so that it becomes antiferromagnetically coupled with the recording layer 410. As seen in FIG. 4C, the first ferromagnetic layer 442 had its magnetization direction switched (or was already) so that it is opposite to that of the recording layer 410. The stabilizing structure 440 in the non volatile memory cell depicted in FIG. 4C is antiferromagnetically coupled with the recording layer 410.

Figure 4D:
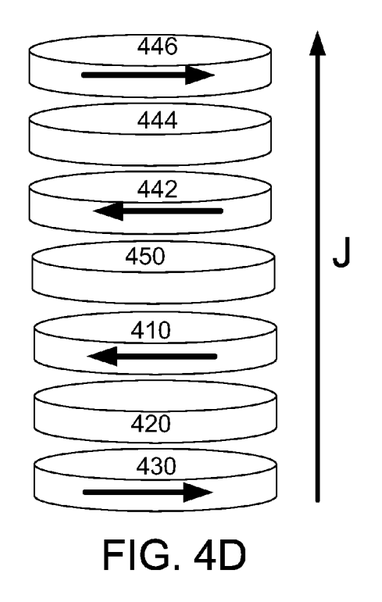

It will also be understood that the stabilizing structure 440 could be ferromagnetically coupled to the recording layer 410. The non volatile memory cell depicted in FIG. 4D illustrates the effect of writing a "1" to a non volatile memory cell that contains a stabilizing structure that is ferromagnetically coupled to the recording layer. As seen in FIG. 4D, the recording layer 410 will affect the first ferromagnetic layer 442 of the stabilizing structure 440 because of the exchange coupling of the recording layer 410 and the stabilizing structure 440. Upon application of the current (from the bottom to the top of the MTJ stack), the ferromagnetic layer 442 will either remain ferromagnetically coupled with the recording layer 410 or will switch its magnetization direction so that it becomes ferromagnetically coupled with the recording layer 410. As seen in FIG. 4D, the first ferromagnetic layer 442 had its magnetization direction switched (or was already) so that it is ferromagnetically aligned with that of the recording layer 410.

Figure 4E:
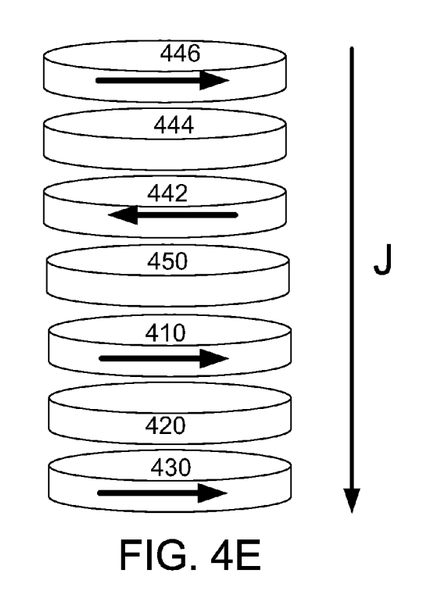

FIG. 4E illustrates the application of a current to write a "0". The current is directed from the top to the bottom of the MTJ stack (i.e. in the direction from the MTJ to the transistor) in order to write a "0" (i.e. the low resistance state, wherein the recording layer 410 and the reference layer 430 have aligned polarities). As seen in FIG. 4E, the current will set the recording layer 410 to a magnetization (indicated by the right pointing arrow in the recording layer 410) that is aligned with that of the reference layer 430. The magnetic orientation of the recording layer 410 will affect the first ferromagnetic layer 442 of the stabilizing structure 440 because of the exchange coupling of the recording layer 410 and the stabilizing structure 440. The embodiment in FIG. 4E is antiferromagnetically coupled so that the first ferromagnetic layer 442 will either remain antiferromagnetically coupled with the recording layer 410 or will switch its magnetization direction so that it becomes antiferromagnetically coupled with the recording layer 410. As seen in FIG. 4E, the first ferromagnetic layer 442 had its magnetization direction switched (or was already) so that it is opposite to that of the recording layer 410. An embodiment that is ferromagnetically coupled (not illustrated herein) would switch the first ferromagnetic layer so that its magnetization direction is aligned with the magnetization direction of the recording layer.

Such an embodiment of a non volatile memory cell can have the exchange coupling (whether ferromagnetic or antiferromagnetic) between the recording layer and the SAF structure that is mediate, or generally in the range of from about 50 to 500 Oe (which is much less than half of the demagnetizing field of about 5000 Oe). Such an embodiment will not have a significant effect on the switching current. In embodiments, the saturation magnetization of the recording layer is relatively low so that a reduction in switching current can be seen. In embodiments, a relatively low saturation magnetization is generally one that is from about 400 emu/cc to about 1300 emu/cc.

Figure 5A:
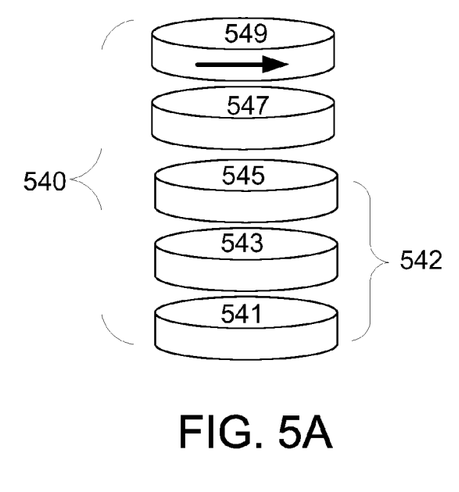
FIGS. 5A through 5D are schematic diagrams of embodiments of a stabilizing structure (FIG. 5A), a STRAM cell including such a stabilizing structure (FIG. 5B), the STRAM cell of FIG. 5B with the STRAM structure antiferromagnetically coupled to the stabilizing structure after a first current has been passed through it in a first direction (FIG. 5C), and the STRAM cell of FIG. 5B with the STRAM structure ferromagnetically coupled to the stabilizing structure after a first current has been passed through it in a first direction (FIG. 5D)

Another embodiment of a stabilizing structure 540 is depicted in FIG. 5A. This embodiment of a stabilizing structure 540 includes a SAF structure 542. The SAF structure 542 generally includes two or more ferromagnetic layers (first ferromagnetic layer 541 and second ferromagnetic layer 545) separated by a nonmagnetic layer 543 (or more than one nonmagnetic layer in the case of more than two ferromagnetic layers). The ferromagnetic layers 541 and 545 are antiferromagnetically coupled through the nonmagnetic layer 543. This embodiment of a stabilizing structure 540 also includes a tunnel barrier spacer layer 547 disposed between the SAF structure 542 and an upper reference layer 549.

The layers of the SAF structure 542 can include similar materials and have similar properties to those discussed above with respect to the stabilizing structure 440 in FIG. 4A. The tunnel barrier spacer layer 547 is generally a material that transmits a spin polarization across it from the upper reference layer 549 to the SAF structure 542 (or vice versa). In embodiments, the tunnel barrier spacer layer 547 can be a material that transmits a high spin polarization across it from the upper reference layer 549 to the SAF structure 542 (or vice versa). Examples of such materials include interfaces between conventional ferromagnets (such as Co, Fe, CoFeB, and their alloys) and insulators such as magnesium oxide (MgO), magnesium nitride ($Mg_xN_y$), and magnesium oxynitride. Any other materials or combination of materials having a relatively high spin polarization may also be used in the tunnel barrier spacer layer 547.

The upper reference layer 549 is generally a layer whose magnetization orientation is or can be pinned to a particular orientation. Materials for the upper reference layer 549 can include, but are not limited to ferromagnetic alloys such as iron (Fe), cobalt (Co), and nickel (Ni) alloys. The upper reference layer 549 can be pinned to a particular orientation as is known to those of skill in the art, including the use of exchange bias with an antiferromagnetically ordered material such as PtMn, IrMn and others. In such embodiments, the upper reference layer 549 can therefore include more than one layer.

Figure 5B:
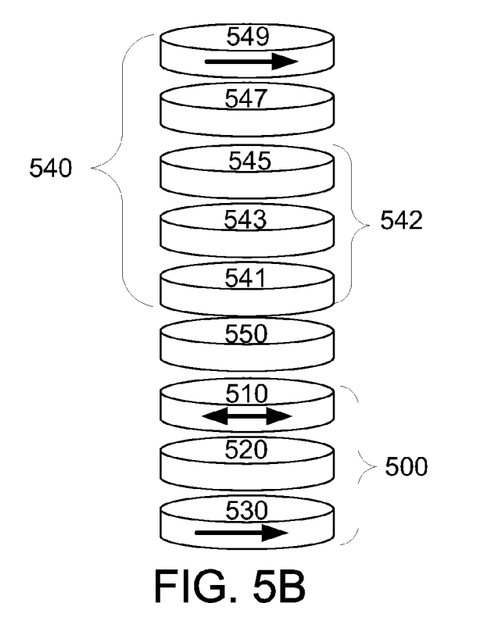

FIG. 5B depicts a stabilizing structure 540 as exemplified with respect to FIG. 5A in combination with a MTJ stack 500 to form an embodiment of a non volatile memory cell. This exemplary non volatile memory cell includes a MTJ stack 500, an exchange coupling spacer layer 550, and a stabilizing structure 540. The MTJ stack 500 is exchange coupled to the SAF structure 542 of the stabilizing structure 540 through the exchange coupling spacer layer 550. The exchange coupling of the SAF structure 542 to the recording layer 510 of the MTJ stack 500 can be either ferromagnetic or antiferromagnetic.

Figure 5C:
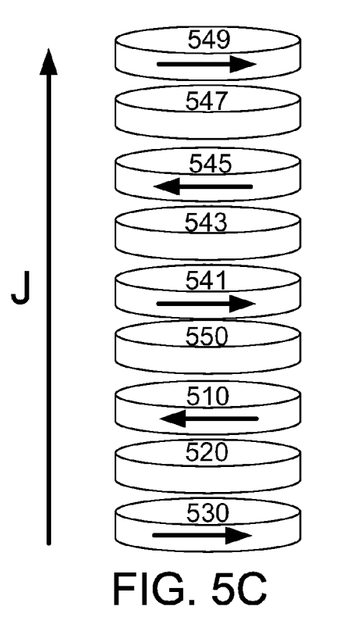

FIG. 5C depicts the non volatile memory cell after application of a current (J in FIG. 5C) that is sufficient to write to the MTJ stack. In this embodiment, the current is directed from the bottom of the MTJ stack to the top of the MTJ stack (i.e. in the direction from the transistor to the MTJ) in order to write a "1" (i.e. the high resistance state, wherein the recording layer 510 and the reference layer 530 have opposite polarities). As seen in FIG. 5C, the current will set the recording layer 510 to a magnetization (indicated by the left pointing arrow in the recording layer 510) that is opposite to that of the reference layer 530. The magnetic orientation of the recording layer 510 will affect the first ferromagnetic layer 541 of the stabilizing structure 540 because of the exchange coupling (in this case antiferromagnetically coupled) of the recording layer 510 and the stabilizing structure 540. The first ferromagnetic layer 541 will then affect the second ferromagnetic layer 545 because of its coupling so that the second ferromagnetic layer 545 is changed (if the first ferromagnetic layer 541 was changed) to be anti-parallel to the first ferromagnetic layer 541. The timing of the switching of the recording layer 510, the first ferromagnetic layer 541, and the second ferromagnetic layer 545 are not necessarily sequential, and may indeed occur at substantially the same time.

Figure 5D:
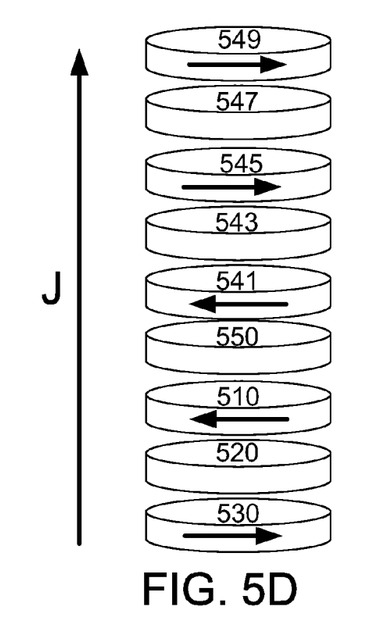

The non volatile memory cell depicted in FIG. 5D illustrates the effect of writing a "1" to a non volatile memory cell that contains a stabilizing structure that is ferromagnetically coupled to the recording layer. As seen in FIG. 5D, the recording layer 510 will affect the first ferromagnetic layer 541 of the stabilizing structure 540 because of the ferromagnetic exchange coupling of the recording layer 510 and the stabilizing structure 540. Upon application of the current (from the bottom to the top of the MTJ stack), the first ferromagnetic layer 541 will either remain ferromagnetically coupled with the recording layer 510 or will switch its magnetization direction so that it becomes ferromagnetically coupled with the recording layer 510. As seen in FIG. 5D, the first ferromagnetic layer 541 had its magnetization direction switched (or was already) so that it is aligned with that of the recording layer 510. The second ferromagnetic layer 545 will then switch to be antiferromagnetically coupled with the first ferromagnetic layer 541.

Switching the non volatile memory cells depicted in FIGS. 5C and 5D to "0" can be accomplished by directing a current in the opposite direction (not depicted herein). It should be noted that in both the embodiments depicted in FIG. 5C and FIG. 5D (as well as that not depicted—switching the cells to "0"), the upper reference layer 549 does not switch because it is pinned in a single direction. The magnetization direction of the upper reference layer 549 can be the same or different than the magnetization of the reference layer 530 of the MTJ stack.

Methods of reading a non volatile memory cell, which can also be referred to as determining the resistance state of the non volatile memory cell can generally include directing a current across the non volatile memory cell (in either direction) and then measuring a voltage, which is indicative of the resistance of the non volatile memory cell. The resistance states (in embodiments two, a low resistance state and a high resistance state) of the non volatile memory cell can be given data states (in embodiments the low resistance state is given a "0" and the high resistance state is given a "1").

Because the upper reference layer 549 is pinned, it (as well as the reference layer 530 of the MTJ stack) can be used to read the resistance state of the non volatile memory cell. The magnetic orientation of the upper reference layer 549, and whether the SAF structure is ferromagnetically or antiferromagnetically coupled to the MTJ stack will dictate whether or not the resistance state (either high if the upper reference layer 549 is parallel to the second ferromagnetic layer 545 of the SAF structure; or low if the upper reference layer 549 is anti-parallel to the second ferromagnetic layer 545 of the SAF structure) of this type of read is the same or the opposite to that of the resistance state of the MTJ stack. For example, as seen in the embodiment depicted in FIG. 5C, if the resistance state was read using the reference layer 530 of the MTJ stack, it would show a high resistance state (because of the opposite alignment of the reference layer 530 and the recording layer 510), which is generally given a value of "1". If this same non volatile memory cell was read using the upper reference layer 549 of the stabilizing structure, it would also show a high resistance state (because of the opposite alignment of the upper reference layer 549 and the second ferromagnetic layer 545 of the SAF structure). Therefore, in this embodiment, the particular configuration of the non volatile memory cell (upper reference layer 549 and reference layer 530 of the MTJ stack having the same pinned direction; and the SAF structure and the recording layer 510 being antiferromagnetically coupled) provides two reading schemes where the resistance states are the same regardless of which way the cell is read.

For purposes of comparison, the configuration of the non volatile memory cell depicted in FIG. 5D (upper reference layer 549 and reference layer 530 of the MTJ stack having the same pinned direction; and the SAF structure and the recording layer 510 being ferromagnetically coupled) will provide different resistance states depending on which way the cell is read from. Such "opposite reading configurations" can be easily considered and compensated for.

Embodiments that utilize an upper reference layer 549 and a tunnel barrier spacer layer 547 can enhance the output signal when reading. The additional tunnel barrier within the overall structure can serve to increase the signal because of the additional spin polarization of the current. In such an embodiment, the tunnel junction in the MTJ stack can be designed to reduce the switching current for writing, and the tunnel junction in the stabilizing structure can be designed to increase the current based on the resistance for reading. Therefore, with two barrier layers, the non volatile memory cell can be designed to both decrease the switching current and increase the reading signal. Furthermore, such a design can further reduce the switching current because of the dual spin-filter effect in embodiments where the coupling between the recording layer and the SAF structure is ferromagnetic, and the upper reference layer and the reference layer within the MTJ stack are parallel. In embodiments where the coupling between the recording layer and the SAF structure is antiferromagnetic, the signal may be reduced because the magnetoresistances are opposite and will therefore cancel; in such embodiments, it may be advantageous to have the magnetoresistance and the resistance area (RA) of the MTJ stack smaller than that of the upper stack (the upper reference layer 549, tunnel barrier spacer layer 547, and second ferromagnetic layer 545).

Figure 6A:
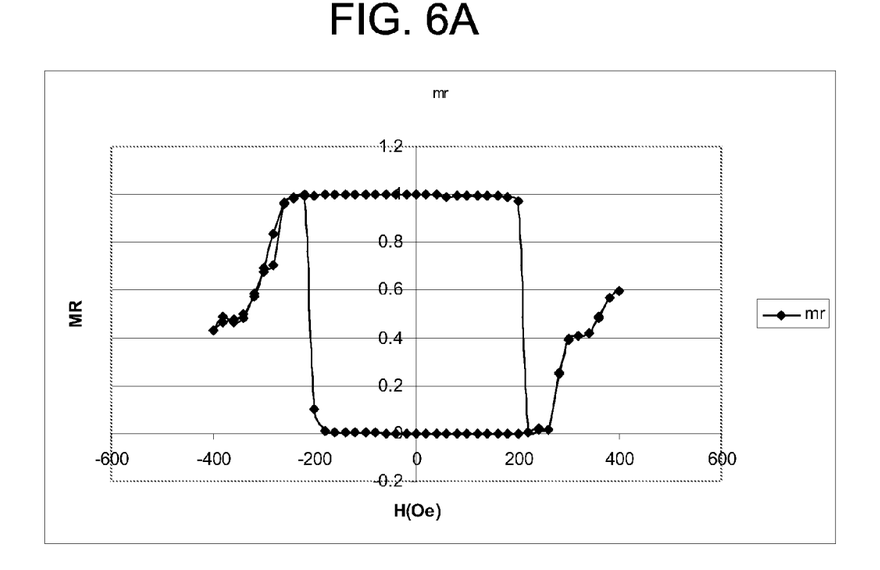
FIGS. 6A through 6D are graphs showing the magnetoresistance (Mr) versus coercivity (H) for a strongly coupled STRAM stack and stabilizing structure (FIG. 6A) and an intermediately coupled STRAM stack and stabilizing structure (FIG. 6B), the magnetoresistance (also referred to as "MR") (Mr) versus switching current (I) for a strongly coupled STRAM stack and stabilizing structure (FIG. 6C) and an intermediately coupled STRAM stack and stabilizing structure (FIG. 6D)
Figure 6B:
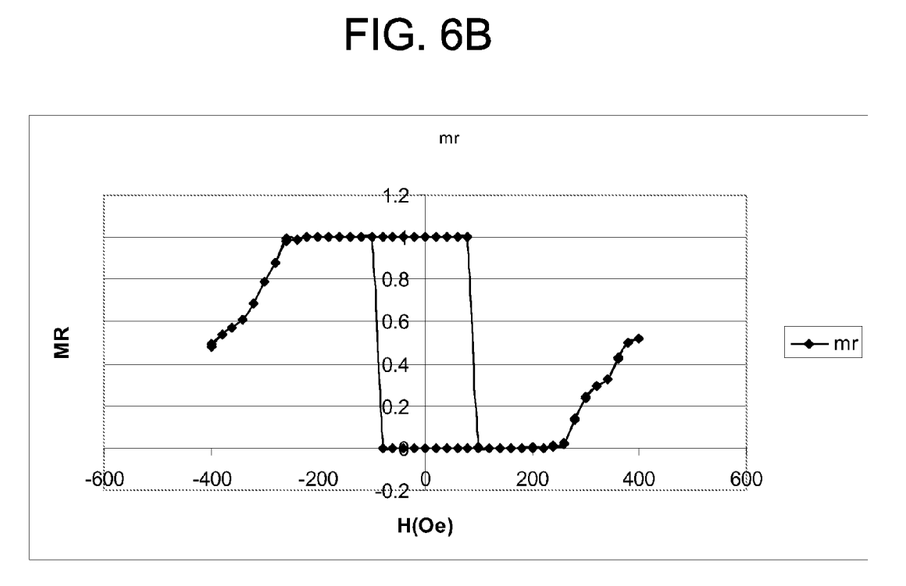
Figure 6C:
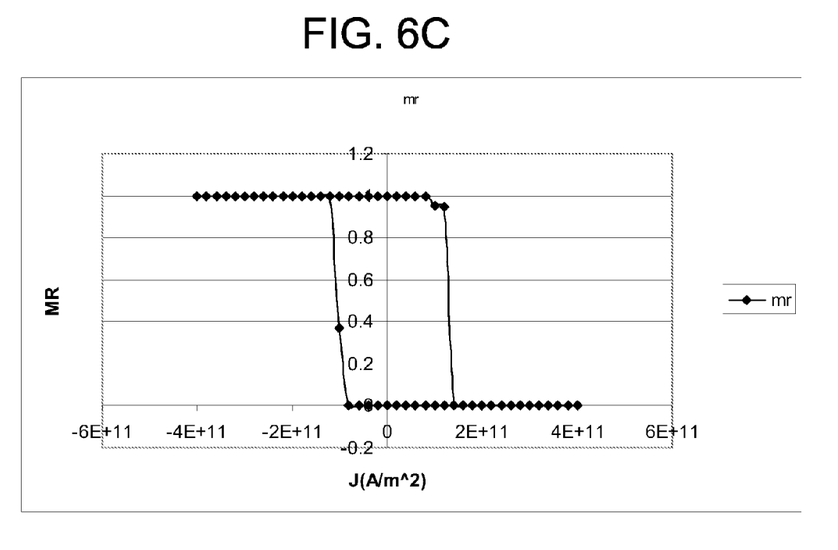
Figure 6D:
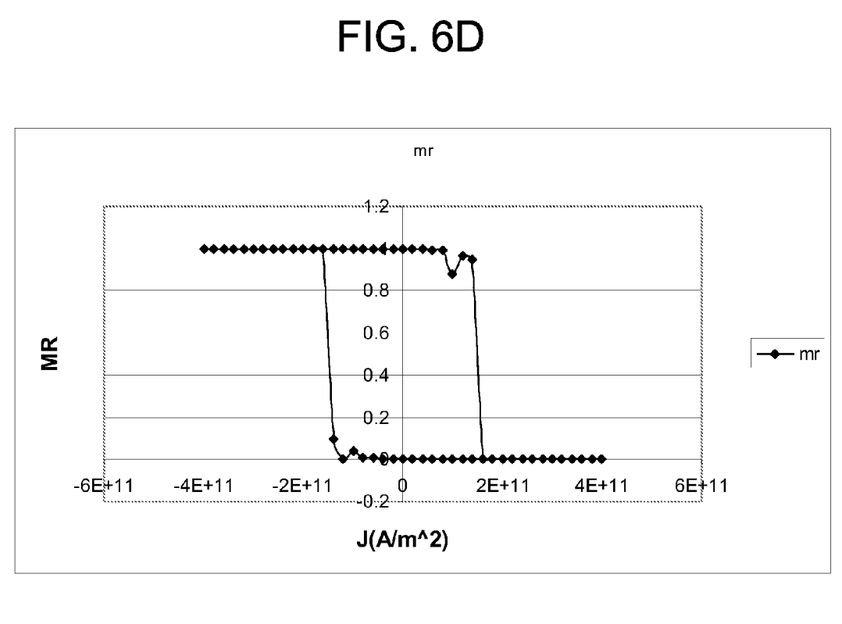

FIGS. 6A and 6B show how the magnetoresistance (MR) affects the thermal stability (H) in Oersted for an intermediately coupled recording layer and SAF structure (FIG. 6A) and for a strongly coupled recording layer and SAF structure (FIG. 6B). FIGS. 6C and 6D show how the magnetoresistance (MR) affects the switching current (J) for an intermediately coupled recording layer and SAF structure (FIG. 6C) and for a strongly coupled recording layer and SAF structure (FIG. 6D). In the strongly coupled pair, the SAF becomes unbalanced, leading to lower thermal stability and higher switching current densities. When the coupling is intermediate, both higher thermal stability and lower switching current densities are achieved.

Figure 7A:
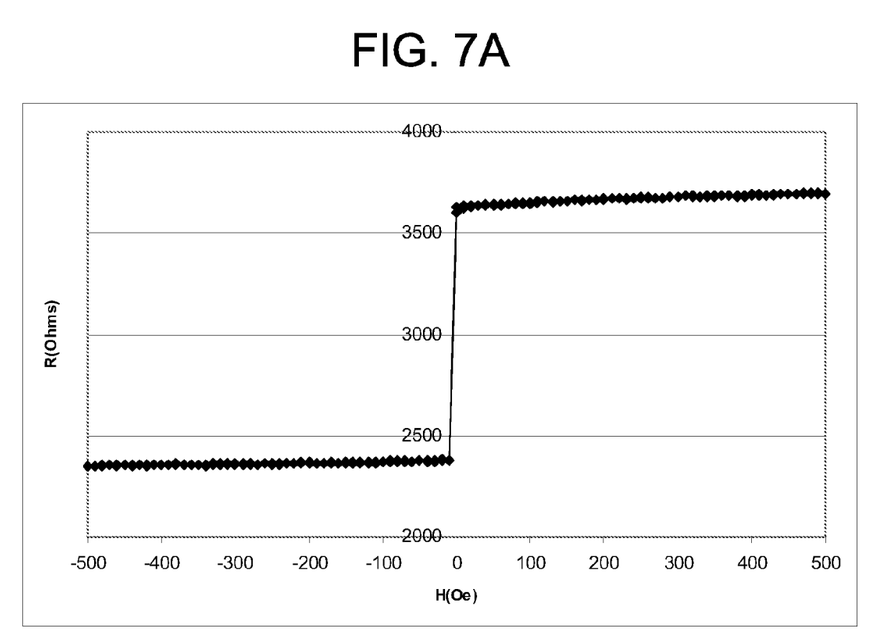
FIGS. 7A and 7B are graphs showing the magnetoresistance versus coercivity (FIG. 7A) and magnetoresistance versus switching current (FIG. 7B) of thin recording layers.
Figure 7B:
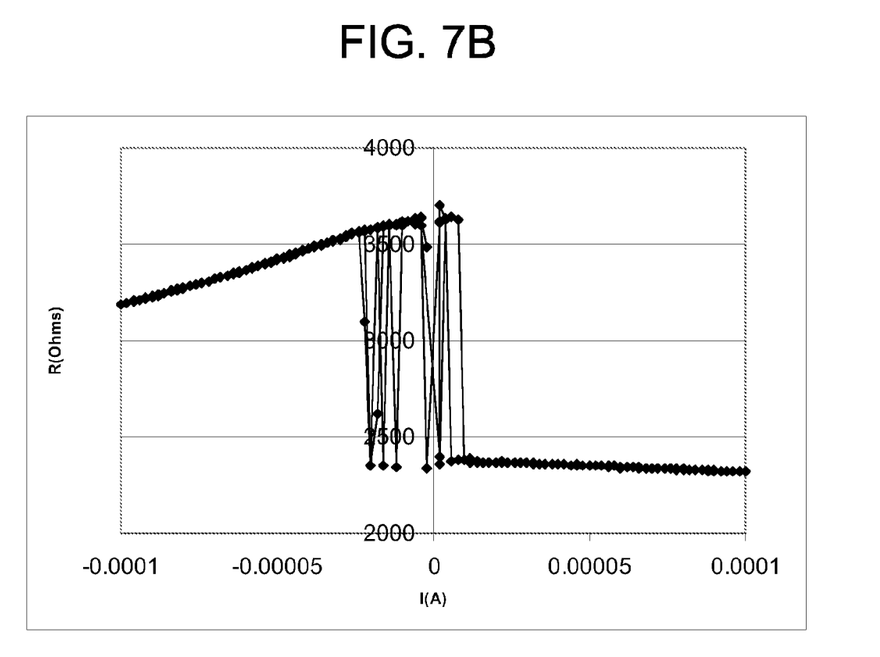

One method of reducing the switching current of a MTJ stack is to reduce the thickness of the recording layer; however, thinner recording layers can create detrimental properties, including lower thermal energy barriers. If the thermal energy barrier (KuV/kT) is less than about 30, the recording layer can become super-paramagnetic at room temperature. FIGS. 7A and 7B show resistance versus current (FIG. 7A) and resistance versus coercivity (FIG. 7B) curves for a STRAM cell having a 17 Angstrom (ø) thick CoFeB recording layer. As seen from FIGS. 7A and 7B, the cell will have a relatively small switching current, but is not very thermally stable because of the super-paramagnetic nature.

Thus, embodiments of NON VOLATILE MEMORY INCLDUING STABILIZING STRUCTURES disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A non volatile memory cell comprising:
   a spin torque transfer random access memory (STRAM) structure comprising:
   a reference layer;
   a tunnel barrier; and
   a recording layer, wherein the tunnel barrier is between the reference layer and the recording layer;
   an exchange coupling spacer layer, wherein the exchange coupling spacer layer consists of copper, tantalum, ruthenium, platinum, gold, magnesium oxide, alumina, titanium oxide, tantalum oxide, or combinations thereof; and
   a stabilizing structure, wherein the exchange coupling spacer layer is between the STRAM structure and the stabilizing structure and exchange couples the recording layer of the STRAM structure to the stabilizing structure, wherein the stabilizing structure comprises a synthetic antiferromagnetic (SAF) structure.

2. The non volatile memory cell according to claim 1, wherein the SAF structure comprises a first ferromagnetic layer, a second ferromagnetic layer and a nonmagnetic spacer layer between the first ferromagnetic layer and the second ferromagnetic layer.

3. The non volatile memory cell according to claim 2, wherein the first ferromagnetic layer of the SAF structure is antiferromagnetically coupled to the recording layer of the STRAM structure.

4. The non volatile memory cell according to claim 2, wherein the first ferromagnetic layer of the SAF structure is ferromagnetically coupled to the recording layer of the STRAM structure.

5. The non volatile memory cell according to claim 1, wherein the exchange coupling between the recording layer of the STRAM cell and the stabilizing structure has a strength from about 50 to about 500 Oe.

6. The non volatile memory cell according to claim 1 having an aspect ratio of about 1.

7. The non volatile memory cell according to claim 1, wherein the recording layer comprises a material having a saturation magnetization of about 400 emu/cc to about 1300 emu/cc.

8. The non volatile memory cell according to claim 1, wherein the stabilizing structure further comprises an upper reference layer, wherein the upper reference layer is positioned opposite the STRAM structure.

9. The non volatile memory cell according to claim 8 further comprising a tunnel barrier spacer layer, wherein the tunnel barrier spacer layer is positioned between the stabilizing structure and the upper reference layer.

10. The non volatile memory cell according to claim 9, wherein the tunnel barrier spacer layer comprises magnesium oxide, magnesium nitride, magnesium oxynitride, alumina, tantalum oxide, titanium oxide, or combinations thereof.

11. The non volatile memory cell according to claim 8 wherein the upper reference layer and the reference layer of the STRAM structure have parallel magnetic orientations.

12. The non volatile memory cell according to claim 1, wherein the exchange coupling spacer layer consists of magnesium oxide, alumina, titanium oxide, tantalum oxide, or combinations thereof.

13. The non volatile memory cell according to claim 12, wherein the exchange coupling spacer layer is about 1 nm thick.

14. A method of determining the state of a non volatile memory cell comprising the steps of:
   providing a non volatile memory cell, the non volatile memory cell comprising:
   a spin torque transfer random access memory (STRAM) structure;
   an exchange coupling spacer layer; and
   a stabilizing structure comprising:

a synthetic antiferromagnetic (SAF) structure that comprises a first ferromagnetic layer, a nonmagnetic spacer layer and a second ferromagnetic layer, wherein the nonmagnetic spacer layer is between the first ferromagnetic layer and the second ferromagnetic layer; and an upper reference layer,
wherein the upper reference layer is proximate to the second ferromagnetic layer, directing a current across the non volatile memory cell, wherein the current is directed from the stabilizing structure to the STRAM structure;

measuring a voltage, wherein the voltage is dependent on the magnetic orientation of the upper reference layer with respect to the second ferromagnetic layer of the SAF structure and the orientation of the upper reference layer with respect to the second ferromagnetic layer can be changed to reflect one of the two states of the non volatile memory cell.

15. The method according to claim 14, wherein the magnetic orientation of the upper reference layer is parallel to the magnetic orientation of the reference layer of the STRAM structure.

16. An apparatus comprising:
a magnetic structure comprising:
a reference layer; and
a free layer;
an exchange coupling spacer layer, wherein the exchange coupling spacer layer consists of copper, tantalum, ruthenium, platinum, gold, magnesium oxide, alumina, titanium oxide, tantalum oxide, or combinations thereof; and a stabilizing layer, wherein the exchange coupling spacer layer is between the magnetic structure and the stabilizing layer and exchange couples the free layer of the magnetic structure to the stabilizing layer, wherein the stabilizing layer comprises a synthetic antiferromagnetic (SAF) structure.

17. The apparatus according to claim 16, wherein the free layer has a thickness from about 1 nm to about 3 nm.

18. The apparatus according to claim 16, wherein the exchange coupling between the free layer of the magnetic structure and the stabilizing layer has a coupling strength from about 50 to about 500 Oe 19. The apparatus according to claim 16 having an aspect ratio of about 1.

20. The apparatus according to claim 16, wherein the stabilizing layer comprises alloys of iron (Fe), cobalt (Co), or nickel (Ni).

21. The apparatus according to claim 16, wherein the SAF structure comprises a first ferromagnetic layer, a second ferromagnetic layer and a nonmagnetic spacer layer between the first ferromagnetic layer and the second ferromagnetic layer.

22. The apparatus according to claim 16, wherein the exchange coupling spacer layer consists of magnesium oxide, alumina, titanium oxide, tantalum oxide, or combinations thereof.

23. The apparatus according to claim 22, wherein the exchange coupling spacer layer is about 1 nm thick.

* * * * *